United States Patent
Vittet et al.

(10) Patent No.: US 6,504,722 B2
(45) Date of Patent: Jan. 7, 2003

(54) ELECTRONIC MODULE COMPRISING COOLING ELEMENTS FOR ELECTRONIC COMPONENTS

(75) Inventors: Jean-Pierre Vittet, Lully (CH); Jean-François Goumaz, Genéve (CH)

(73) Assignee: Acqiris, Plan-les-Ouates (CH)

( * ) Notice: Subject to any disclaimer, the term of this patent is extended or adjusted under 35 U.S.C. 154(b) by 0 days.

(21) Appl. No.: 09/896,164

(22) Filed: Jun. 29, 2001

(65) Prior Publication Data

US 2001/0046121 A1 Nov. 29, 2001

Related U.S. Application Data

(63) Continuation of application No. PCT/CH98/00563, filed on Dec. 30, 1998.

(51) Int. Cl.$^7$ ................................................ H05K 7/20
(52) U.S. Cl. .................. 361/704; 361/687; 361/689; 361/690; 361/715; 361/719; 361/720; 174/16.1; 165/80.2; 165/104.33
(58) Field of Search ................................ 361/690, 699, 361/688, 704, 707–711, 715, 719–720; 165/80.2, 80.3, 185; 174/16.1, 16.3; 257/706, 707, 712, 713, 718, 719, 727

(56) References Cited

U.S. PATENT DOCUMENTS

| | | | | |
|---|---|---|---|---|
| 4,639,829 A | * | 1/1987 | Ostergren et al. | 361/718 |
| 4,665,467 A | | 5/1987 | Speraw et al. | 361/388 |
| 4,748,495 A | * | 5/1988 | Kucharek | 257/713 |
| 4,753,287 A | | 6/1988 | Horne | 165/80.3 |
| 4,770,242 A | * | 9/1988 | Daikoku et al. | 165/185 |
| 5,005,638 A | * | 4/1991 | Goth et al. | 165/80.4 |
| 5,394,299 A | * | 2/1995 | Chu et al. | 361/705 |
| 5,420,753 A | * | 5/1995 | Akamatsu et al. | 361/719 |
| 5,940,266 A | * | 8/1999 | Hamilton et al. | 361/695 |
| 5,999,407 A | * | 12/1999 | Meschter et al. | 361/704 |
| 6,214,647 B1 | * | 4/2001 | Di Giacomo et al. | 438/122 |
| 6,252,768 B1 | * | 6/2001 | Lin | 361/687 |

FOREIGN PATENT DOCUMENTS

EP  0 369 115 A1  5/1990 ......... H01L/23/433

* cited by examiner

*Primary Examiner*—Gerald Tolin
(74) *Attorney, Agent, or Firm*—Pearne & Gordon LLP

(57) ABSTRACT

A data acquisition module (1) includes an interconnection board (15) with several electronic components (3, 18) mounted on at least one side of said board. A protective cover (16) mounted opposite said side covers the electronic components (3, 18).

In order to cool notably the module's analog-to-digital converters, a piston 41 connected to the protective cover (16) is pressed by a spring (43) against the upper side of at least one electronic component (3) so as to establish a thermal bridge between said electronic component and said protective cover.

The piston is mounted in a piston carrier fastened on the cover (16). The diameter of the portion (410) of the piston (41) that is in contact with the electronic component (3) to be cooled is smaller than the diameter of the portion (411) of the piston that is in contact with the piston carrier (40).

14 Claims, 5 Drawing Sheets

ELECTRONIC MODULE COMPRISING COOLING ELEMENTS FOR ELECTRONIC COMPONENTS

This application is a continuation of PCT/CH98/00563, filed Dec. 30, 1998.

FIELD OF THE INVENTION

The present invention concerns an electronic module, notably an electronic module comprising electronic components and cooling elements for these electronic components. The present invention concerns more particularly, but not exclusively, an electronic module for high frequency data acquisition comprising several channels, whereas each channel includes a high frequency analog-to-digital converter as well as cooling elements for these converters.

RELATED ART

Many types of data acquisition systems are known, for example transitory recorders and digital oscilloscopes, in which it is necessary to convert one or several analog signals into one or several digital signals capable of being stored in a digital memory and processed by a digital processor. During the past few years, modular acquisition systems have appeared, generally comprising a frame in which various acquisition modules can be inserted in parallel in slots. Each module comprises connection means for inserting and removably connecting it in the system, as well as generally one or several acquisition channels capable of digitizing the input signals observed. For example, acquisition modules conform to the PCI, CompactPCI, VXI or PXI standards are known that define the mechanical and electrical characteristics of the intermodular connection means. The present invention applies in particular to this type of module.

FIG. 1 illustrates diagrammatically a prior art acquisition module. Various components 2, 3, 5 are assembled on a printed circuit board 15. The module 1 is designed to be inserted into adapted slots of a mother board (not represented), by means of connectors (not represented) on the lower or rear side of the board. The module is provided with a front panel 12 fitted with a prehensile organ 11 as well as with a number of connectors, for example BNC connectors, corresponding to the module's number of channels. An input signal can be supplied to each channel by means of these connectors.

Each channel generally includes an input amplifier 2, an analog-to-digital converter 3 as well as a circuit 5 for processing and storing the supplied non-itemized digital signal. The signal thus processed is then supplied to a microprocessor (not represented) capable of receiving and processing the signals supplied by different channels and on different modules.

The analog-to-digital converters 3 must by virtue of the Nyquist principle work at a sampling frequency that is double the frequency of the signal to be sampled in order to supply a correct digital representation of the signal. In the case of very high frequency signals, for example signals having a frequency of several hundred MHz, the converters 3 thus also work at very high speed and thus produce a considerable thermal energy that must be evacuated.

In the prior art, the heat produced by each analog-to-digital converter is generally evacuated by means of a radiator glued or fastened on the upper side of the converter. Cold air 13 is furthermore sometimes insufflated vertically onto the radiators.

The converters 3 are components that occupy a relatively large surface on the module's board 15, so that the arrangement indicated in FIG. 1 is generally adopted, i.e. the converters are placed side-by-side and over one-another. However, with this arrangement, the air temperature close to the upper converters is higher than the air temperature close to the lower converters (in the case where the air is insufflated from the bottom). Tests have shown that the temperature difference from one converter to another can be as much as 10° approximately. In a module comprising four high frequency converters, there can thus be a difference of more than thirty degrees between the temperature of the insufflated air 13 and the temperature of the exiting hot air 14.

The upper analog-to-digital converter thus works in less favorable conditions than the lower converter, which is cooled better. The upper converters thus age much faster and the different working conditions make difficult for example an equalizing of the supplied digital signals.

An aim of the present invention is therefore to remedy these different problems and to supply an electronic module that is improved over the prior art modules.

BRIEF SUMMARY OF THE INVENTION

According to the invention these aims are achieved by means of a module having the characteristics of claim 1, preferred embodiments being further indicated in the dependent claims.

In particular, these aims are achieved by placing a removable protective cover over the module's PCB board, preferably covering all or a substantial part of the board, and that can also be used as a radiator to evacuate the heat produced by the electronic components. The cover can be manufactured from a simple flat or profiled sheet, cut and possibly folded over. A thermal bridge is established between the cover and the components to be cooled. The thermal bridge includes at least one element connected to the cover, preferably a compressible element capable of adapting to the thickness of the components, for example a piston pressed by a spring against the components to be cooled. The piston is preferably mounted on a piston carrier connected to the cover; preferably, several pistons pressed against different components on the same board are mounted in a same piston carrier, thus allowing the temperature of the various components, for example of different analog-to-digital converters in an acquisition system, to be made uniform.

The cover, the piston carrier and the pistons are preferably made of materials having a very low heat resistance. The contact surface between the pistons and the piston carrier is preferably maximized so as to encourage heat exchanges between the pistons and the piston carrier; for this purpose, the pistons will for example have at least a conical profile portion.

Although the invention applies particularly well to the cooling of analog-to-digital converters in a high-frequency acquisition system, the one skilled in the art will understand that the invention can also be applied to the cooling of any type of components producing considerable heat in any type of electronic module, for example also to the cooling of microprocessors or signal processors.

The term module includes in the present application and in the claims any kind of electronic module, in particular any type of module capable of being inserted in a slot of a motherboard of an electronic processing system.

It is known from the prior art how to use a cover over electronic components as a radiator. Solutions of this kind have been described in patent documents U.S. Pat. Nos. 4,235,283, 5,177,667, 5,228,502, 5,394,229, EP-B1-0,079, 424, EP-B1-0,097,157, EP-B1-0,111,709, EP-B1-0,369,115, EP-B1-0,552,787 or EP-A1-673,064 for example. None of these solutions is however adapted to the cooling by air circulation of a module of large size (approximately 300 cm$^2$ in a preferred embodiment of the invention), constituted of a printed circuit board designed for being removably inserted in the slots of a data acquisition system. Furthermore, these solutions often use covers of a complex shape that cannot be manufactured simply from a simple flat or profiled sheet. Finally, in most of these documents, the electronic components are partitioned by the cover, i.e. each element finds itself in a compartment defined by the shape of the cover. It is thus generally not possible to insufflate air between the cover and the board to cool the components; when a gap sometimes exists between the cover and the board, this gap usually does not allow air to be insufflated on the entire height of the electronic components, so that this air can cool only the base of the electronic components but not the upper part in which the semi-conductor element is usually placed. Furthermore, each component being lodged in a partitioned space with little air circulation between the components, it is difficult to make uniform the temperature of electronic components, for example of analog-to-digital converters which must operate at temperatures as close as possible.

Furthermore, these solutions are generally only adapted to chips mounted in flip-chip fashion; the solutions offered cannot however be transposed to the case of usual components, for example Ball Grid Arrays (BGA), mounted on a standard printed board.

BRIEF SUMMARY OF THE DRAWINGS

The invention will be better understood with the aid of the description of an embodiment of the invention given as example and illustrated by the FIGS. showing.

DETAILED DESCRIPTION OF THE INVENTION

Figure 1:
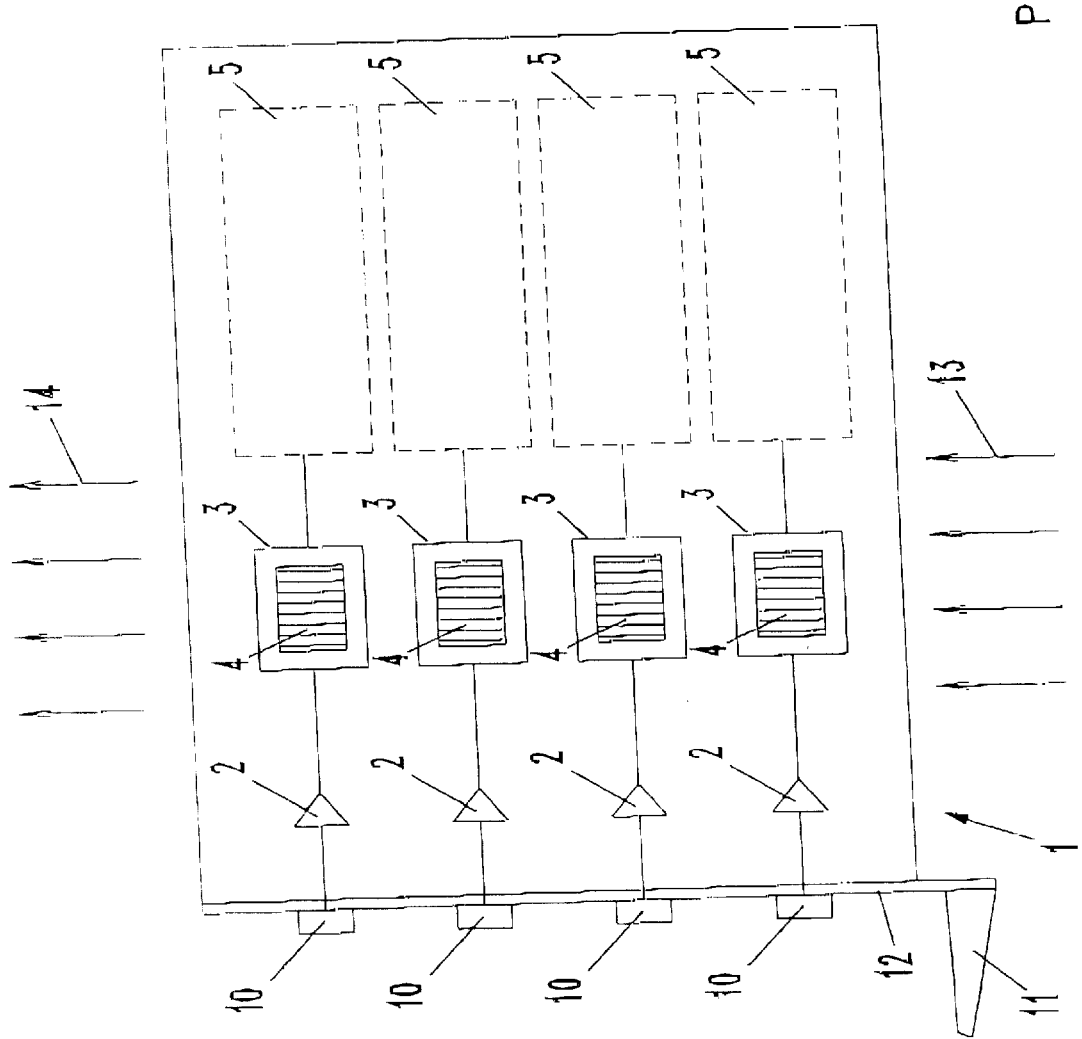
FIG. 1 a diagrammatic view of an acquisition module according to the prior art as mentioned here above.
Figure 2:
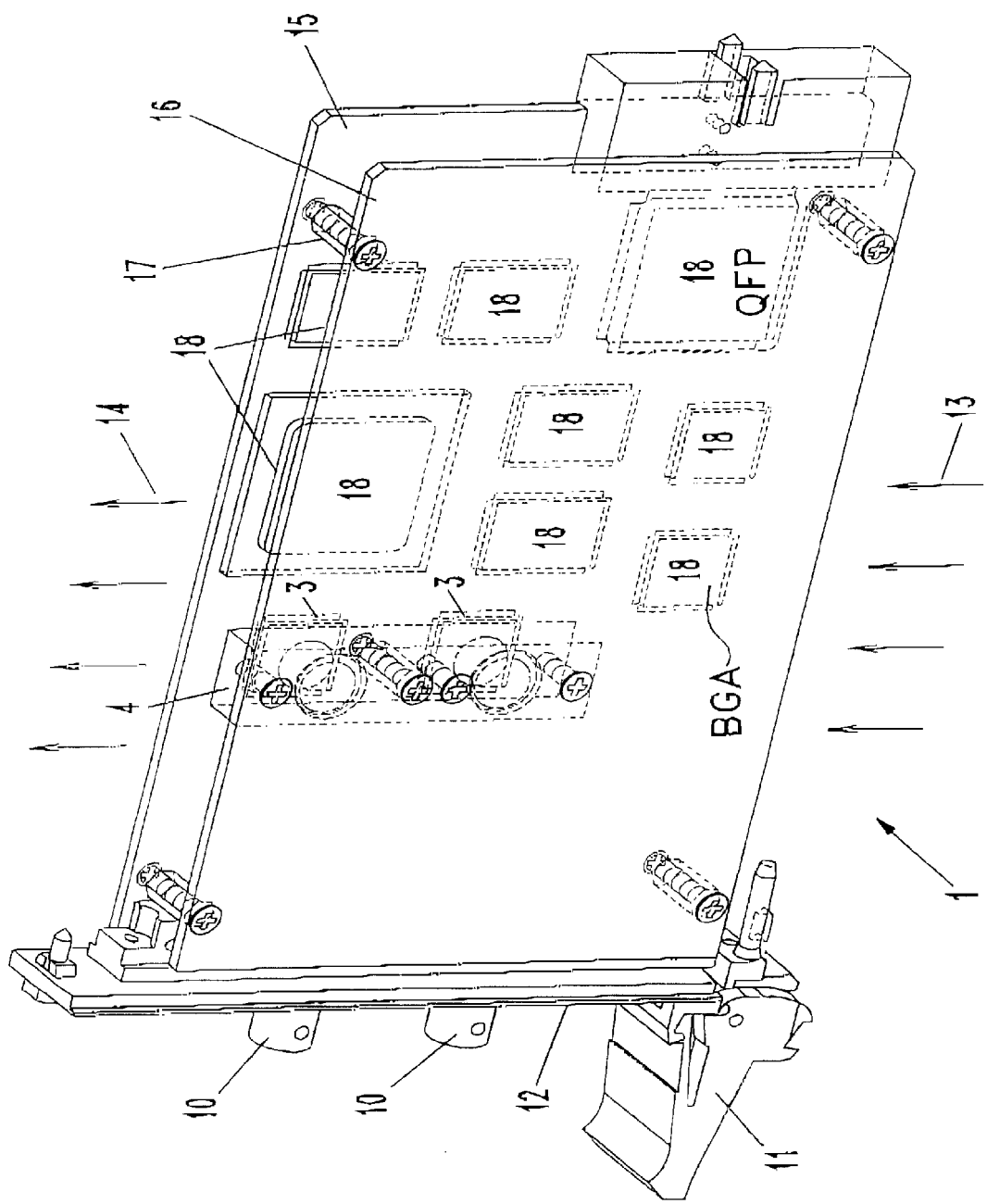
FIG. 2 a perspective and partially transparent view of a module according to the present invention.

FIG. 2 illustrates in perspective as an example a two-channel data acquisition module 1 cooled according to the invention. Although all the illustrated examples represent two-channel acquisition modules, it is obvious that the invention applies also to modules comprising any number of channels. The module 1 is principally constituted by a printed circuit board 15 on which components 3 and 18 are mounted. In this example, the module is designed to be inserted in the slots of an acquisition system that can comprise several modules. To this effect, the module includes connection means on one side, so that the module can be removably inserted and electrically connected with a motherboard (not represented). The arrangement of the connection means is preferably conform to the PCI, CompactPCI, VXI or PXI standards or to any other standard adapted to the interconnection of acquisition modules. A front panel 12 contains various module-operating elements (not represented) as well as BNC connectors 10 for analog input signals. The module 1 can be inserted into or removed from the acquisition system by means of a prehensile organ 11. Cold air 13 can be insufflated on the components 3, 18, preferably from below, whilst the heated air 14 escapes from the top of the module. The air can flow around all the components 3, 18 as well as on the upper surface of the components 3.

According to the invention, the board 15 is covered by a protective cover 16 that in this example protects the whole of the components 3, 18 of the board and is fastened in this example by screwed columns 17. The cover 16 offers a mechanical protection to the components 3, 18 and prevents the risks of destruction through electrostatic shocks in case of contact with a user. The cover is preferably not closed on the module's sides, so that the air can circulate between the board 15 and the cover 16. According to the invention, the cover further allows to dissipate the heat produced by at least certain components 3 of the module, for example the analog-to-digital converters. The cover is preferably made from a simple flat or profiled metal sheet and cut to the dimensions of the board 15, whereas one or several sides can possibly be folded over.

A thermal bridge is established between the electronic components to be cooled 3 and the cover 16, by means of an element 4 integrally connected with the cover and pressing against the upper side of the components 3. The heat resistance of the thermal bridge is minimized as much as possible so as to improved the heat transfer in the direction of the cover 16 that thus acts as a large-size radiator.

The height of the columns 17 is preferably designed so that the cover 16 is not in direct contact with the board's thickest components 3, 18 and so that the air can also circulate between the cover 16 and the board of a module inserted in a neighboring slot.

Figure 3:
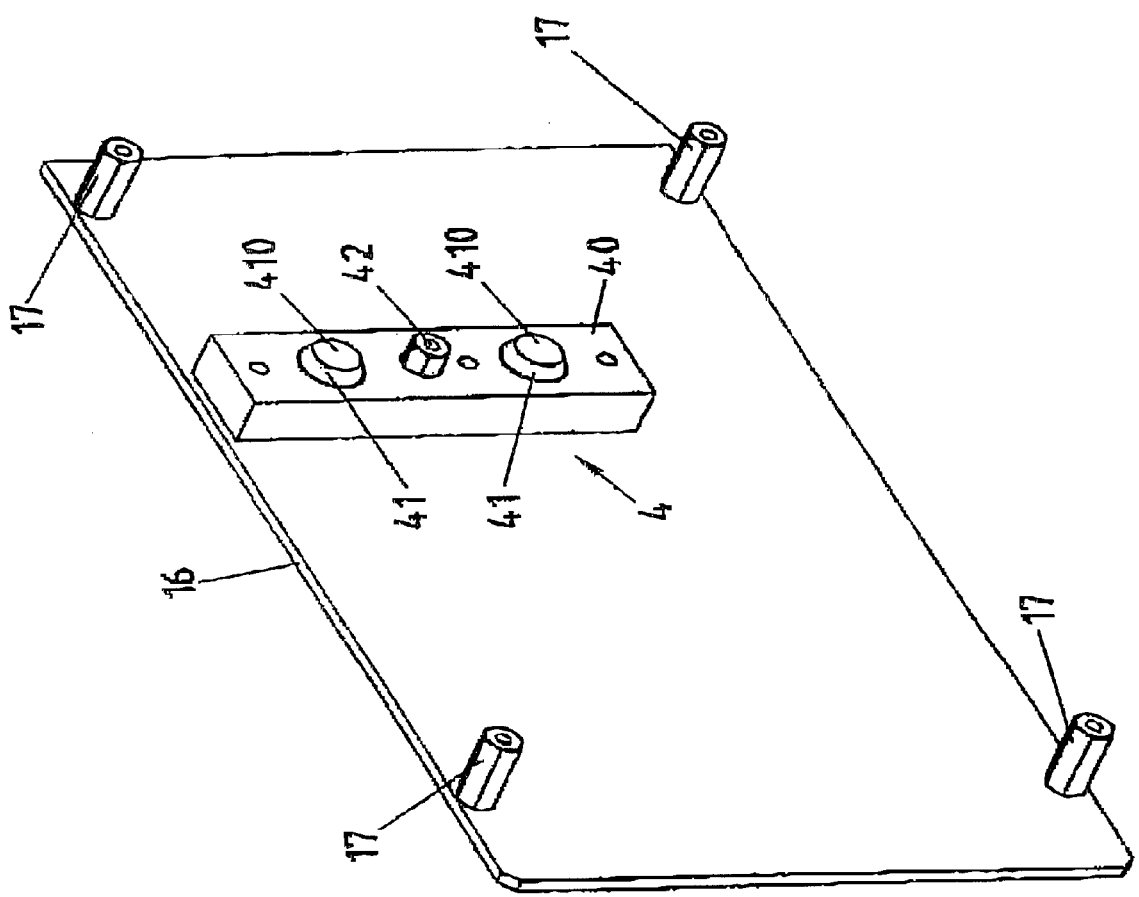
FIG. 3 a perspective view from below of a module cover according to the present invention, provided with a thermal bridge according to the present invention.
Figure 4:
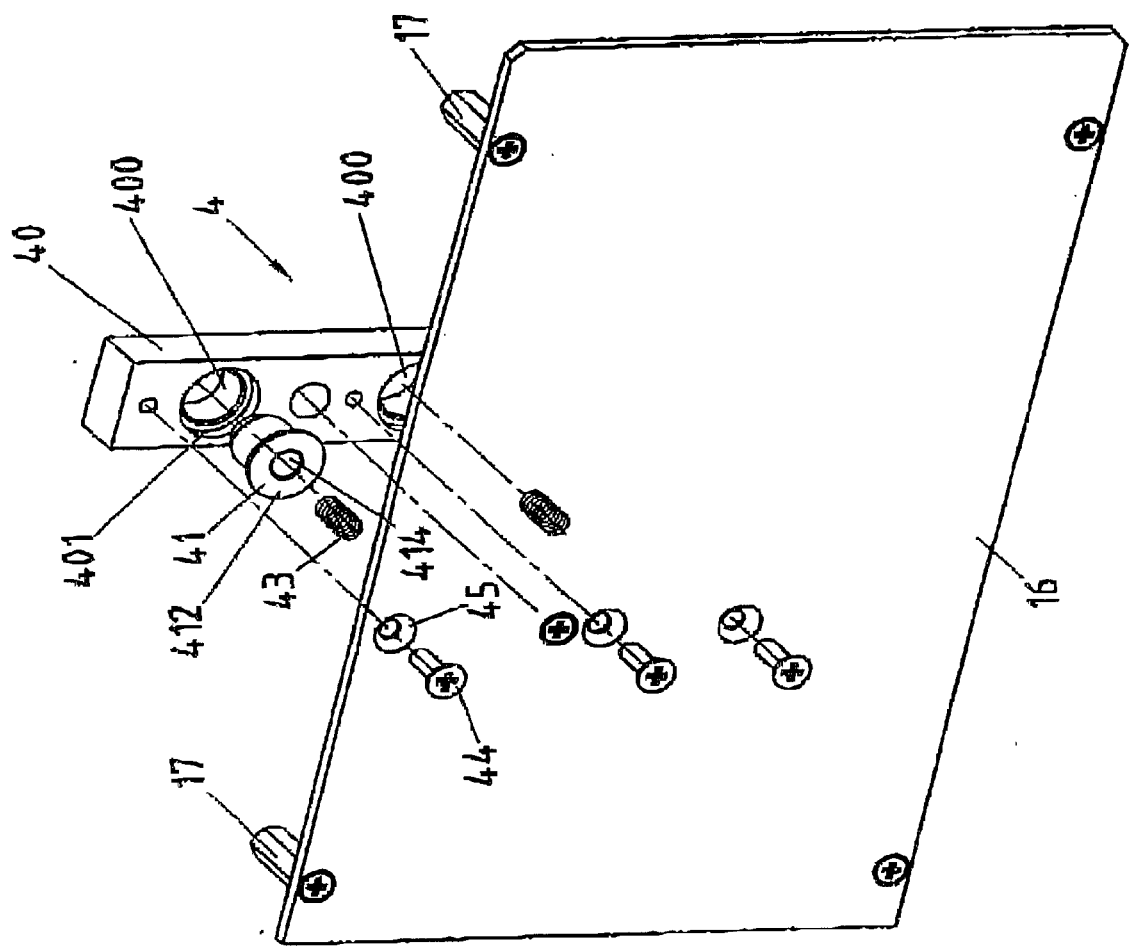
FIG. 4 a perspective view from above of a module cover according to the present invention, provided with a thermal bridge according to the present invention represented in exploded view.
Figure 5:
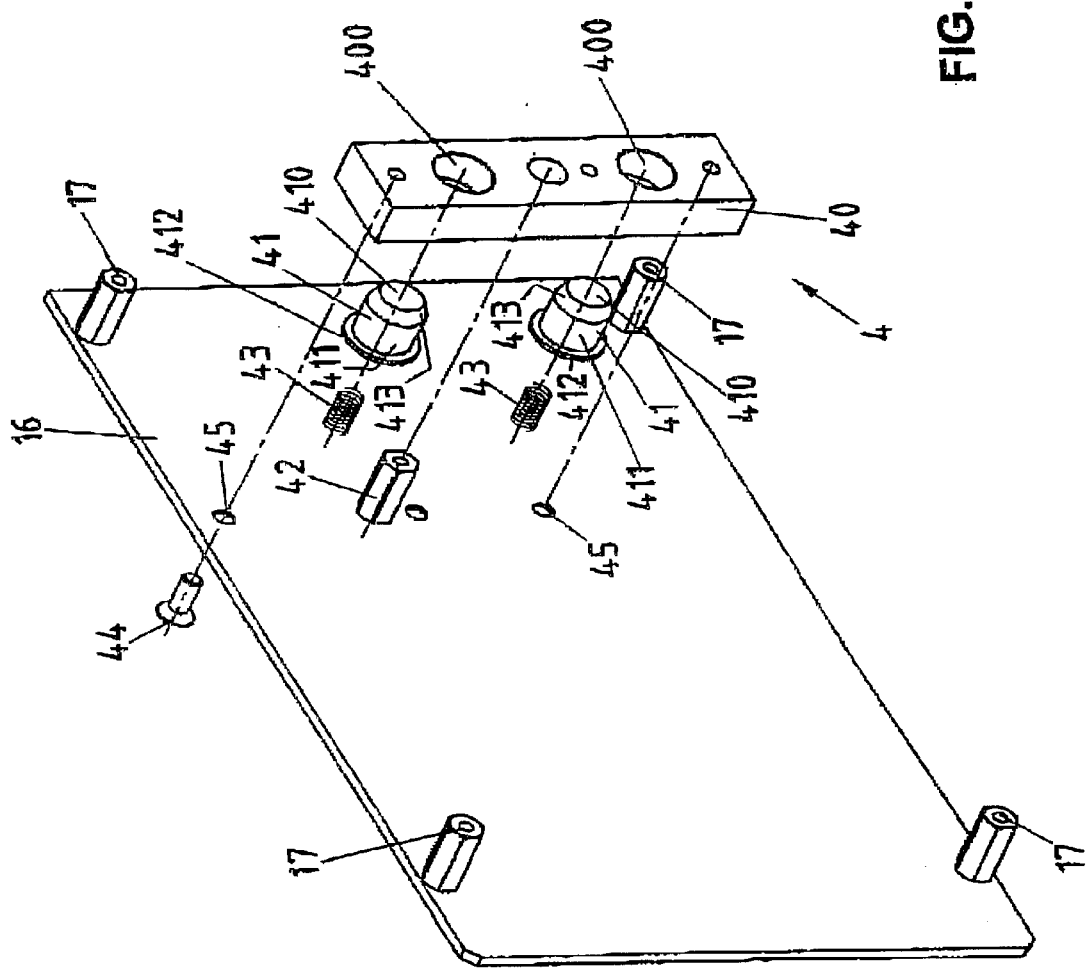
FIG. 5 a perspective view from below of a module cover according to the present invention, provided with a thermal bridge according to the invention represented in exploded view.

The structure of the thermal bridge 4 according to a preferred embodiment will now be described with the aid of FIGS. 3 to 5. The thermal bridge 4 includes a piston carrier 40 fastened for example by means of screws 44 to the protective cover, over the components to be cooled. The cover is made of a simple sheet of the size of the printed circuit board 15 (approximately 300 cm$^2$); the only modification that has to be made to the cover to adapt it to another arrangement of the electronic components on the board 15 is to change the location of the through holes 45 for the screws 44, so as to move the piston carrier 40.

In a variant embodiment, it is also possible to fasten the carrier 40 by means of clips or to crimp it to the cover.

The piston carrier 40 includes one or several openings (or cylinders) 400 in which the pistons 41 can move longitudinally. The pistons are provided with an annular rim 412 corresponding to an annular groove 401 in the openings 400, so that the piston cannot come out of the opening 400 when the piston carrier 40 is screwed on the cover 16. A compressible element, preferably a coil spring 43, is inserted in an opening 414 in each piston so as to move it away from the cover 16; the spring's force is chosen so that the piston head 410 presses with a force of about 10 Newtons on the component to be cooled 3, thus allowing a good contact and a good heat transfer without risk of destroying the component.

The piston head has a diameter corresponding preferably more or less to that of the upper side of the component to be cooled; a non circular head section, for example square or rectangular, can also be adopted. Preferably, the piston head includes a protuberant central portion (not represented) of a diameter smaller than that of the piston head and of a height of a few tenths of millimeters, in order to ensure a quality contact between the piston and precisely the portion of the component in which the heat source is located. It is also possible to use a slightly convex piston head so as to guarantee an excellent contact even in case the component to be cooled is not properly aligned. In order to improve the heat transfer between these two components, the contact surface will preferably be coated with a film of heat-conducting paste. The heat produced by the components to be cooled is thus transmitted with a minimal heat resistance to the piston, so that the difference of temperature between the housing of the component 3 and the piston 41 is for example only of 3 to 6 degrees approximately.

In order to increase the heat exchange surface between the surface piston 41 and the piston carrier 40, the section of the pistons and the openings 400 will be as large as possible; for this purpose, the pistons 41 are provided with a tapered portion 413 linking the head 410 of the piston in contact with the electronic component 3 and the portion 411 of the piston in contact with the piston carrier 40. A silicon grease for lubricating and allowing the sliding of the piston in the opening, is preferably further used to improve the heat transfer between the pistons and the carrier.

Several pistons 41 can be place in the same piston carrier 40, in order to make uniform the temperature between the different electronic components in contact with these different pistons. The springs 43 allow the piston to adapt to the variations in thickness of these various components. In the case of components having very different dimensions, it is also possible to use pistons of different length or diameter in the same module 1 and even in the same piston carrier 40. The length or force of the springs 43 can also be adapted to the components to be cooled. It is also naturally possible to screw several piston carriers 40 on the same cover 16.

In order to ensure that the piston heads 410 are efficiently held onto the components 3, the piston carrier 40 will preferably be fastened or screwed by a column 42 directly onto the printed circuit board 15 close to the components to be cooled 3. It is also possible to fasten the cover 16 directly onto the board 15 close to the components 3.

The pistons 41, the piston carrier 40 and the cover 16 will be manufactured from one or several materials that are good heat conductors, preferably of metal, for example of aluminum. The spring 43 itself can participate to the heat transfer between the piston and the cover; it will preferably be chosen of a good heat conductive metal. The pistons and the piston carrier are preferably electrically oxidated; the cover is also preferably black or of dark color. In order to increase the contact surface between the cover and the ambient air, at least one portion of the cover can be rough, profiled or at least not flat. Cold air, for example at a speed of 1 to 3 meters per second, will moreover be injected onto the cover, for example between the board 15 and the protective cover 16 or on the latter's two sides, in order to cool it more efficiently.

To the extent of the available choice, one will preferably use components 3 to be cooled that are provided with a housing capable of sinking a large part of the heat produced by the upper side in contact with the piston head. For example, electronic components 3 will preferably be used that have housings with inverted cavity of the type BGA or QFP (quad flat pack) housings or BGA housings with a chip mounted in flip-chip fashion, possibly provided with surface components on the housing's upper side.

What is claimed is:

1. An electronic module for a computer that has a motherboard with an associated electrical connection portion for receiving the electronic module, the module comprising:

an interconnection board having major, planar panels and peripheral sides, the board having, at one side, a portion that is removably connectable with the connection portion of the computer for electrical interconnection between the electronic module and the motherboard;

a plurality of packaged electronic component chips mounted on at least one of the major panels of the interconnection board;

a cover having major, planar panels and peripheral sides, the cover extending adjacent to the panel of the interconnection board on which the packaged electronic component chips are mounted; and a thermally conductive element connected with the cover and pressing against one of the packaged electronic component chips;

the cover being spaced from the interconnection board and the packaged electronic component chips a distance such that convective air flow caused by heat from the packaged electronic component chips moves between the cover and the interconnection board around the packaged electronic component chips, and the cover having a thickness between its major panels sufficiently small to dissipate heat conducted to the cover.

2. The electronic module as set forth in claim 1, wherein the cover is made of a flat sheet of material.

3. The electronic module as set forth in claim 1, wherein the module has an overall width size between distant panels, one each of the interconnection board and the cover, such that the electronic module fits within an expansion slot area of the computer.

4. The electronic module as set forth in claim 1, wherein the interconnection board includes at least one connector for connection to a data acquisition lead, and at least some of the plurality of packaged electronic component chips function to process acquired data.

5. The electronic module as set forth in claim 1, wherein the cover is connected only to the interconnection board and the packaged electronic component chips thereon for dissipation of heat within the computer.

6. The electronic module as set forth in claim 1, including removable fasteners connecting the cover to the interconnection board.

7. The electronic module as set forth in claim 1, wherein the thermally conductive element is a first thermally conductive element, the module including a plurality of thermally conductive elements, each thermally conductive element connected with the cover and pressing against a respective one of the packaged electronic component chips.

8. The electronic module as set forth in claim 1, wherein the thermally conductive element includes a spring component.

9. The electronic module as set forth in claim 1, wherein the thermally conductive element includes a movable piston.

10. The electronic module as set forth in claim 9, wherein the piston is electrically oxidated.

11. The electronic module as set forth in claim 1, wherein at least one of the packaged electronic component chips includes a circuit mounted in a BGA housing with an inverted cavity.

12. The electronic module as set forth in claim 1, wherein at least one of the packaged electronic component chips includes a circuit mounted in a flip-chip fashion within a BGA housing.

13. The electronic module as set forth in claim 1, wherein at least one of the packaged electronic component chips includes a circuit mounted in a QFP housing.

14. The electronic module as set forth in claim 1, wherein the plurality of packaged electronic component chips provide at least portions of several data channels, at least some of the packaged electronic component chips include analog-to-digital converters, the thermally conductive element engages a packaged electronic component chip that includes an analog-to-digital converter.

* * * * *